United States Patent
Inoue et al.

(10) Patent No.: US 11,632,043 B2
(45) Date of Patent: Apr. 18, 2023

(54) CIRCUIT DEVICE (71) Applicant: Seiko Epson Corporation, Tokyo (JP)

(72) Inventors: Katsumi Inoue, Matsumoto (JP); Yusuke Sano, Shiojiri (JP); Motoaki Nishimura, Chino (JP)

(73) Assignee: SEIKO EPSON CORPORATION ( * ) Notice: Subject to any disclaimer, the term of this patent is extended or adjusted under 35 U.S.C. 154(b) by 0 days.

(21) Appl. No.: 17/706,853

(22) Filed: Mar. 29, 2022

(65) Prior Publication Data
US 2022/0321002 A1 Oct. 6, 2022

(30) Foreign Application Priority Data

Mar. 30, 2021 (JP) .............................. JP2021-056394

(51) Int. Cl.
H02M 3/07 (2006.01)
H02H 3/20 (2006.01)
H02M 1/32 (2007.01)
H03K 17/082 (2006.01)

(52) U.S. Cl.
CPC .............. *H02M 3/07* (2013.01); *H02H 3/202* (2013.01); *H02M 1/32* (2013.01); *H03K 17/0822* (2013.01); *H03K 2217/0054* (2013.01)

(58) Field of Classification Search
CPC ............ H02M 3/07; H02M 1/32; H02M 1/08; H03K 17/0822
See application file for complete search history.

(56) References Cited

U.S. PATENT DOCUMENTS

| 9,564,796 | B1 | 2/2017 | Ryan | |
|---|---|---|---|---|
| 2004/0150927 | A1* | 8/2004 | Strayer | H02H 9/04 361/82 |
| 2006/0274557 | A1* | 12/2006 | Ball | G05F 1/573 363/19 |
| 2007/0114951 | A1* | 5/2007 | Tsen | H05B 45/46 315/291 |
| 2012/0287540 | A1* | 11/2012 | Dobkin | H02H 1/06 361/89 |
| 2018/0254644 | A1* | 9/2018 | Cho | H02J 7/04 |

* cited by examiner

*Primary Examiner* — Sibin Chen
(74) *Attorney, Agent, or Firm* — Harness, Dickey & Pierce, P.L.C.

(57) ABSTRACT

A circuit device includes a regulator, a charge pump circuit, an overvoltage detection circuit, and a control circuit. The regulator regulates a power supply voltage. The charge pump circuit outputs, a gate control voltage, to a gate node of an N-type transistor provided between a power supply node and a load, based on a regulated voltage. The overvoltage detection circuit detects an overvoltage of the regulated voltage. The control circuit controls to stop the charge pump circuit when the overvoltage is detected by the overvoltage detection circuit.

10 Claims, 7 Drawing Sheets

CIRCUIT DEVICE

The present application is based on, and claims priority from JP Application Serial Number 2021-056394, filed Mar. 30, 2021, the disclosure of which is hereby incorporated by reference herein in its entirety

BACKGROUND

1. Technical Field

The present disclosure relates to a circuit device and the like.

2. Related Art

U.S. Pat. No. 9,564,796 discloses a power supply circuit having a function of protecting a load from an overvoltage. In U.S. Pat. No. 9,564,796, a power transistor is provided between a power supply and a load, and a control circuit controls supply of a power supply voltage to the load by controlling a gate voltage of the power transistor. The control circuit monitors an input voltage, and controls the gate voltage of the power transistor such that a voltage input to the load is constant when the input voltage is detected to be an overvoltage, thereby protecting the load from the overvoltage and continuing an operation of the load without interruption.

In a configuration that controls a gate voltage of a transistor provided between a power supply and a load, the transistor may fail when an overvoltage is applied to the transistor. The above-mentioned U.S. Pat. No. 9,564,796 discloses a function of protecting a load from an overvoltage, and does not disclose protection of a power transistor.

SUMMARY

One aspect of the present disclosure relates to a circuit device that controls an N-type transistor provided between a power supply node and a load. The circuit device includes: a regulator configured to regulate a power supply voltage from the power supply node to output a regulated voltage; a charge pump circuit configured to perform a charge pump operation based on the regulated voltage to output a gate control voltage to a gate node of the N-type transistor; an overvoltage detection circuit configured to detect an overvoltage of the regulated voltage and output an overvoltage detection signal that is a detection result; and a control circuit configured to perform control to stop the charge pump circuit based on the overvoltage detection signal when the overvoltage detection circuit detects the overvoltage.

DESCRIPTION OF EXEMPLARY EMBODIMENTS

Hereinafter, a preferred embodiment of the present disclosure will be described in detail. The present embodiment to be described below does not unduly limit contents described in the claims, and not all configurations described in the present embodiment are necessarily essential elements.

1. Circuit Device and Electronic Machine

Figure 1:
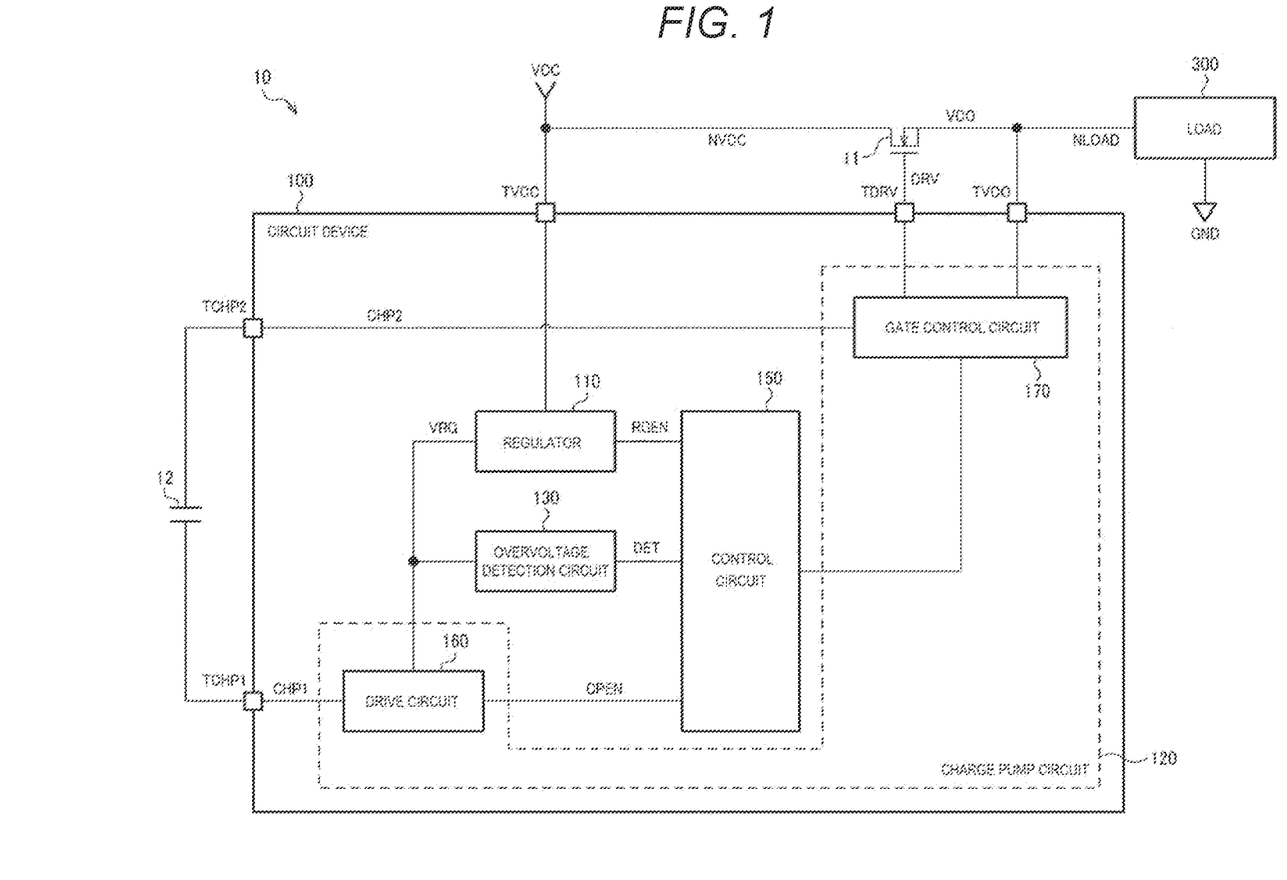
FIG. 1 is a configuration example of a circuit device and an electronic machine.

FIG. 1 is a configuration example of a circuit device 100 and an electronic machine 10 according to the present embodiment. The electronic machine 10 includes an N-type transistor 11, a load 300, and the circuit device 100. The electronic machine 10 may be, for example, a printing apparatus, a video projection apparatus, a wearable apparatus, an information processing apparatus, a display apparatus, a television receiver, or a portable information terminal, but is not limited thereto, and may be various devices using a DC power supply voltage VCC.

The N-type transistor 11 is provided between a power supply node NVCC and the load 300. Specifically, a drain of the N-type transistor 11 is coupled to the power supply node NVCC, and a source of the N-type transistor 11 is coupled to a node NLOAD of the load 300. The N-type transistor 11 is a power transistor, and supplies the power supply voltage VCC to the load 300 when the N-type transistor 11 is on, and cuts off supply of the power supply voltage VCC to the load 300 when the N-type transistor 11 is off.

The power supply voltage VCC is supplied to the power supply node NVCC from a DC power supply. The DC power supply is, for example, an ACDC converter, a DCDC converter or a battery. Although not shown in FIG. 1, these DC power supplies may be provided in the electronic machine 10.

The load 300 is a circuit operated by the power supply voltage VCC supplied to the node NLOAD via the N-type transistor 11. The node NLOAD is a power supply node for the load 300. The load 300 is, for example, a power supply stabilizing capacitor that is provided between the node NLOAD and a ground voltage GND, a processing device that executes processing in the electronic machine 10, or a motor driver that drives a motor. The load 300 is not limited thereto, and may be a circuit for implementing various functions of the electronic machine 10.

The circuit device 100 controls the supply of the power supply voltage VCC to the load 300 by outputting a gate control voltage DRV to a gate of the N-type transistor 11. The circuit device 100 includes a regulator 110, a charge pump circuit 120, an overvoltage detection circuit 130, a control circuit 150, terminals TVCC, TDRV, TCHP1 and TCHP2, and a source voltage input terminal TVCO. The circuit device 100 is, for example, an integrated circuit device in which a plurality of circuit elements are integrated at a semiconductor substrate. The terminals are, for example, a pad of an integrated circuit device or a terminal of a package accommodating the integrated circuit device.

The regulator 110 regulates the power supply voltage VCC from the power supply node NVCC to output a regulated voltage VRG. The terminal TVCC is coupled to the power supply node NVCC, and the power supply voltage VCC is supplied to the regulator 110 via the terminal TVCC. The regulator 110 is a step-down regulator that outputs the regulated voltage VRG lower than the power supply voltage VCC. The regulator 110 is, for example, a linear regulator, but is not limited thereto, and may be various types of DCDC converters.

The charge pump circuit 120 performs a charge pump operation based on the regulated voltage VRG to output the gate control voltage DRV to the gate of the N-type transistor 11. One end of a boost capacitor 12 is coupled to the terminal TCHP1, and the other end of the boost capacitor 12 is coupled to the terminal TCHP2. The boost capacitor 12 is a flying capacitor, and the charge pump circuit 120 performs the charge pump operation using the boost capacitor 12. The terminal TDRV is coupled to the gate of the N-type transistor 11, and the charge pump circuit 120 outputs the gate control voltage DRV to the gate of the N-type transistor via the terminal TDRV. The charge pump circuit 120 generates the gate control voltage DRV higher than a source voltage VCO of the N-type transistor 11 using the regulated voltage VRG. Accordingly, the N-type transistor 11 is on when the charge pump circuit 120 is operating, and thus the power supply voltage VCC is supplied to the load 300 via the N-type transistor 11.

The overvoltage detection circuit 130 detects an overvoltage of the regulated voltage VRG and outputs an overvoltage detection signal DET that is a detection result. The overvoltage detection circuit 130 determines whether the regulated voltage VRG is higher than a predetermined detection voltage, and outputs an active overvoltage detection signal DET when the regulated voltage VRG is determined to be higher than the detection voltage. Here, "active" is a logical level indicating an overvoltage.

The control circuit 150 performs control to stop the charge pump circuit 120 based on the overvoltage detection signal DET when the overvoltage is detected by the overvoltage detection circuit 130. The control circuit 150 stops the charge pump operation by outputting an enable signal CPEN indicating disable to the charge pump circuit 120 when the overvoltage detection signal DET is active.

In the above embodiment, since the gate control voltage DRV is output based on the regulated voltage VRG, an overvoltage may be applied to the gate of the N-type transistor 11 when the regulated voltage VRG is an overvoltage.

In this regard, according to the present embodiment, the control circuit 150 stops the charge pump circuit 120 when the overvoltage detection circuit 130 detects the overvoltage of the regulated voltage VRG, and thus the N-type transistor 11 is protected from the overvoltage. Although the power supply to the load 300 may not be properly controlled when the N-type transistor 11 fails due to an overvoltage, according to the present embodiment, a failure of the N-type transistor 11 due to an overvoltage can be prevented.

More specifically, the charge pump circuit 120 performs boosting based on the regulated voltage VRG with reference to the source voltage VCO of the N-type transistor 11 to output the gate control voltage DRV. The circuit device 100 includes the source voltage input terminal TVCO to which the source voltage VCO is input. The charge pump circuit 120 performs the boosting with reference to the source voltage VCO input to the source voltage input terminal TVCO.

The boosted voltage based on the regulated voltage VRG is a gate-source voltage of the N-type transistor 11, and thus an overvoltage may be applied between the gate and the source of the N-type transistor 11 when the regulated voltage VRG is an overvoltage. According to the present embodiment, the control circuit 150 stops the charge pump circuit 120 when the overvoltage detection circuit 130 detects the overvoltage of the regulated voltage VRG, and thus the N-type transistor 11 is protected from the overvoltage.

Further, in the present embodiment, VCO is the source voltage of the N-type transistor 11, VRG is the regulated voltage, VgsMax is a maximum rating of a gate-source voltage of the N-type transistor 11, and Vdet is a detection voltage of the overvoltage. At this time, the gate control voltage is DRV=VCO+VRG. The overvoltage detection circuit 130 detects the overvoltage by comparing the detection voltage Vdet, the detection voltage Vdet satisfying VRG<Vdet<VgsMax, with the regulated voltage VRG. The VRG in "VRG<Vdet<VgsMax" means the regulated voltage VRG when the regulator 110 is normal.

Since DRV−VCO=VRG is applied between the gate and source of the N-type transistor 11, a comparison between the regulated voltage VRG and the detection voltage Vdet corresponds to a comparison between the gate-source voltage and the detection voltage Vdet. According to the present embodiment, VRG<Vdet<VgsMax, so that the overvoltage of the gate-source voltage can be detected by the detection voltage Vdet that does not exceed the maximum rating VgsMax of the gate-source voltage.

Further, in the present embodiment, the detection voltage Vdet satisfies VRG<Vdet<VgsMax<VCC, in which VCC is the power supply voltage.

Since the regulated voltage VRG is lower than the power supply voltage VCC, an output node of the regulator 110 may output the same voltage as the power supply voltage VCC to the maximum, for example, when an abnormality occurs in which a power supply node and the output node of the regulator 110 are short-circuited. As described above, since the regulated voltage VRG is the gate-source voltage of the N-type transistor 11, the power supply voltage VCC may be applied to the maximum between the gate and source, and since VgsMax<VCC, the N-type transistor 11 may fail.

In this regard, according to the present embodiment, since the overvoltage of the gate-source voltage is detected by the detection voltage Vdet that does not exceed the maximum rating VgsMax of the gate-source voltage, the N-type transistor 11 can be protected from the overvoltage.

In the present embodiment, the charge pump circuit 120 includes a drive circuit 160 and a gate control circuit 170. The enable signal CPEN of the charge pump circuit 120 is input to the drive circuit 160 from the control circuit 150. The drive circuit 160 outputs a drive signal CHP1 to one end of the boost capacitor 12 based on the regulated voltage VRG when the enable signal CPEN indicates enable. A signal CHP2 from the other end of the boost capacitor 12 is input to the gate control circuit 170. The gate control circuit 170 outputs the gate control voltage DRV based on the signal CHP2 and the source voltage VCO of the N-type transistor 11. The control circuit 150 stops the drive circuit 160 by outputting the enable signal CPEN indicating disable when the overvoltage is detected by the overvoltage detection circuit 130.

According to the present embodiment, when the enable signal CPEN indicates enable, the drive circuit 160 outputs the drive signal CHP1 and the gate control circuit 170 outputs the gate control voltage DRV. Then, when the enable signal CPEN indicates disable, an output of the drive signal CHP1 is stopped, so that an output of the gate control voltage DRV is stopped. Accordingly, the control circuit 150 can stop the charge pump circuit 120 by outputting the enable signal CPEN indicating disable when the overvoltage is detected.

2. Detailed Configuration Example

Figure 2:
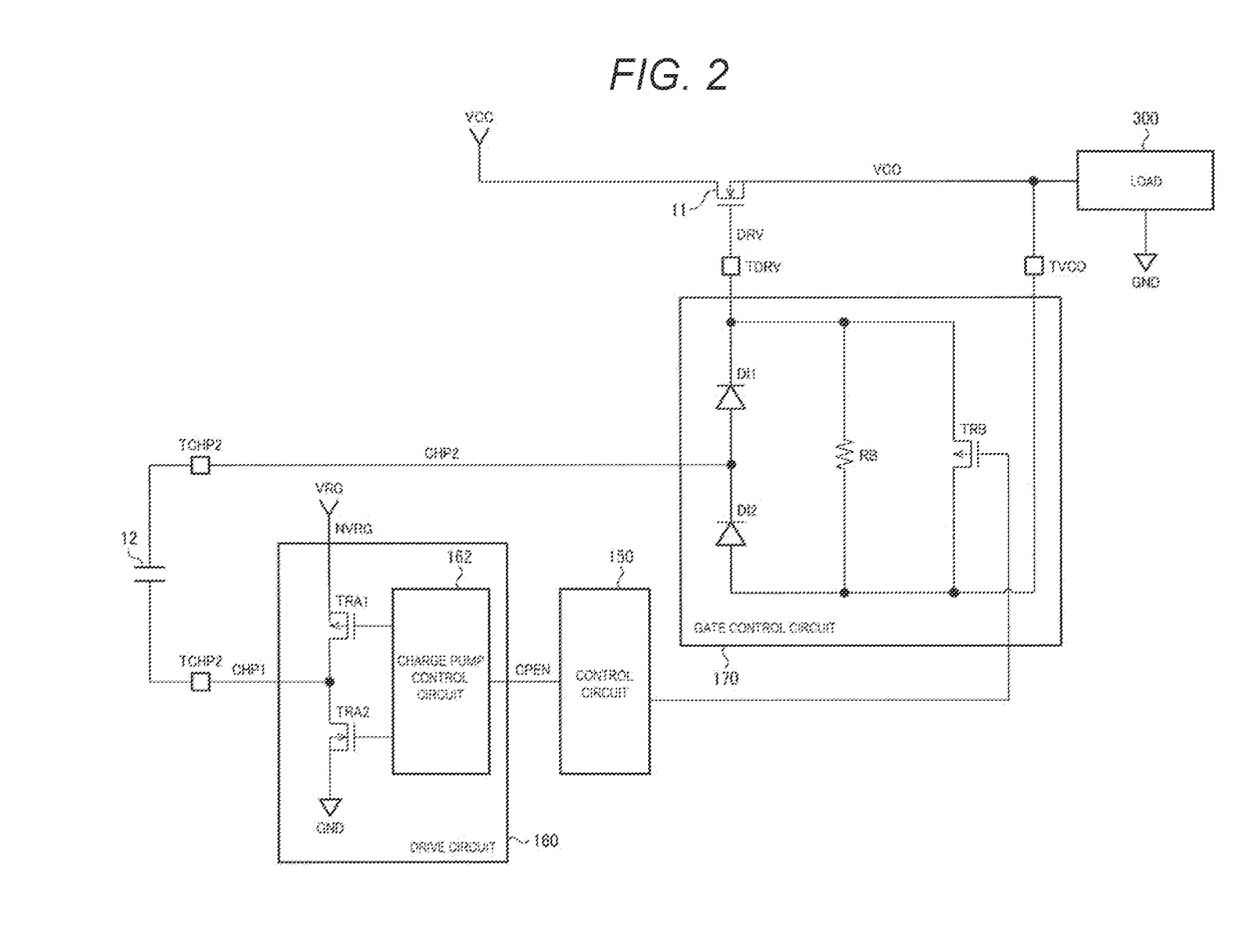
FIG. 2 is a first detailed configuration example of a drive circuit and a gate control circuit.

FIG. 2 is a first detailed configuration example of the drive circuit 160 and the gate control circuit 170. The drive circuit 160 includes a first transistor TRA1, a second transistor TRA2, and a charge pump control circuit 162. The gate control circuit 170 includes a first diode DI1, a second diode DI2, a resistor RB, and a switch circuit TRB.

The first transistor TRA1 is provided between an output node NVRG of the regulator 110 and one end of the boost capacitor 12. Specifically, the first transistor TRA1 is a P-type transistor, and has a source coupled to the output node NVRG of the regulator 110 and a drain coupled to the terminal TCHP1.

The second transistor TRA2 is provided between the one end of the boost capacitor 12 and a ground node. Specifically, the second transistor TRA2 is an N-type transistor, and has a source coupled to the ground node and a drain coupled to the terminal TCHP1.

The first diode DI1 is provided between the other end of the boost capacitor 12 and the gate of the N-type transistor 11. A forward direction of the first diode DI1 is from the other end of the boost capacitor 12 to the gate. That is, an anode of the first diode DI1 is coupled to the terminal TCHP2 and a cathode of the first diode DI1 is coupled to the terminal TDRV. The first diode DI1 is, for example, a Schottky barrier diode.

The second diode DI2 is provided between the source of the N-type transistor 11 and the other end of the boost capacitor 12. A forward direction of the second diode DI2 is from the source of the N-type transistor 11 to the other end of the boost capacitor 12. That is, an anode of the second diode DI2 is coupled to the source voltage input terminal TVCO, and a cathode of the second diode DI2 is coupled to the terminal TCHP2. The second diode DI2 is, for example, a Schottky barrier diode.

The resistor RB is provided between the gate and the source of the N-type transistor 11. Specifically, one end of the resistor RB is coupled to the cathode of the first diode DI1 and the terminal TDRV, and the other end of the resistor RB is coupled to the anode of the second diode DI2 and the source voltage input terminal TVCO.

The switch circuit TRB is provided between the gate and the source of the N-type transistor 11. Specifically, the switch circuit TRB is a P-type transistor. A source of the P-type transistor is coupled to the cathode of the first diode DI1 and the terminal TDRV, and a drain of the P-type transistor is coupled to the anode of the second diode DI2 and the source voltage input terminal TVCO. A signal for controlling the switch circuit TRB on or off is input to a gate of the P-type transistor from the control circuit 150.

The control circuit 150 fixes the N-type transistor 11 to off by turning on the switch circuit TRB. For example, when the circuit device 100 is shut down, the control circuit 150 turns on the switch circuit TRB to reliably cut off the power supply to the load 300.

Figure 3:
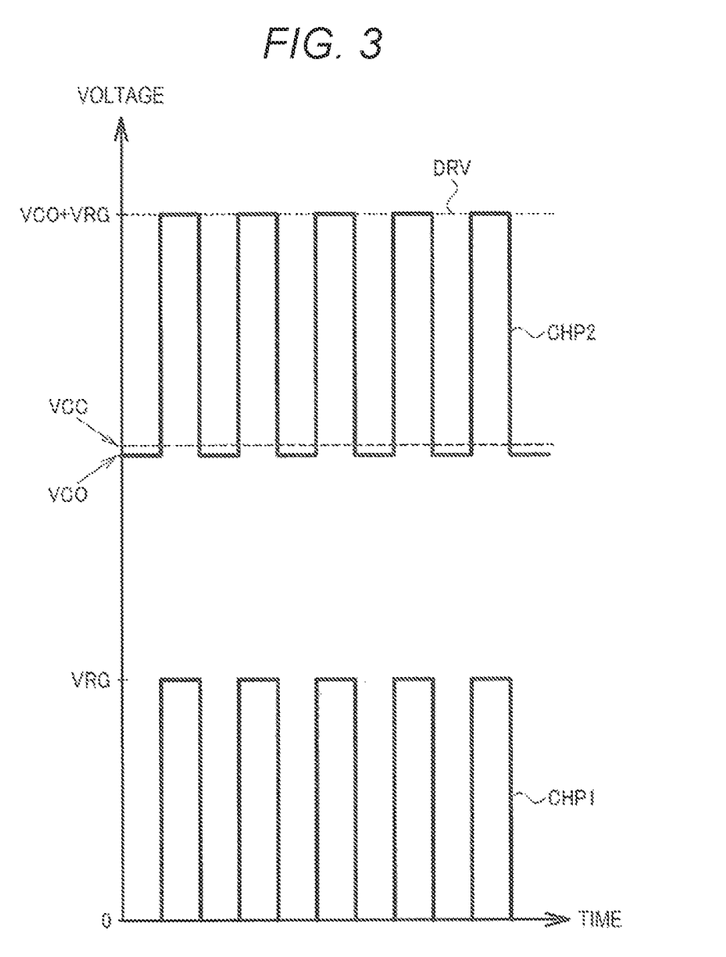
FIG. 3 is a waveform diagram showing an operation of a charge pump circuit.

FIG. 3 is a waveform diagram showing an operation of the charge pump circuit 120. Hereinafter, the description will be made ignoring forward voltages of the first diode DI1 and the second diode DI2.

The charge pump control circuit 162 alternately turns on the first transistor TRA1 and the second transistor TRA2 when the enable signal CPEN indicates enable. The drive signal CHP1 is 0 V when the first transistor TRA1 is off and the second transistor TRA2 is on. At this time, the signal CHP2 is the same voltage as the source voltage VCO due to the second diode DI2. When the first transistor TRA1 changes from off to on and the second transistor TRA2 changes from on to off, the drive signal CHP1 rises from 0 V to the regulated voltage VRG. Accordingly, the signal CHP2 is a voltage higher than the source voltage VCO by the regulated voltage VRG.

The voltage VCO+VRG is the gate control voltage DRV and is output to the gate of the N-type transistor 11 via the first diode DI1. The gate of the N-type transistor 11 is charged by the charge supplied by the drive circuit 160, and the gate control voltage DRV is maintained at VCO+VRG in a steady state.

The charge pump control circuit 162 does not drive the first transistor TRA1 or the second transistor TRA2 when the enable signal CPEN indicates disable. Accordingly, the charge pump circuit 120 is stopped. For example, the charge pump control circuit 162 keeps the first transistor TRA1 on and the second transistor TRA2 off. After the charge pump circuit 120 is stopped, the gate-source voltage of the N-type transistor 11 is 0 V due to the resistor RB.

Figure 4:
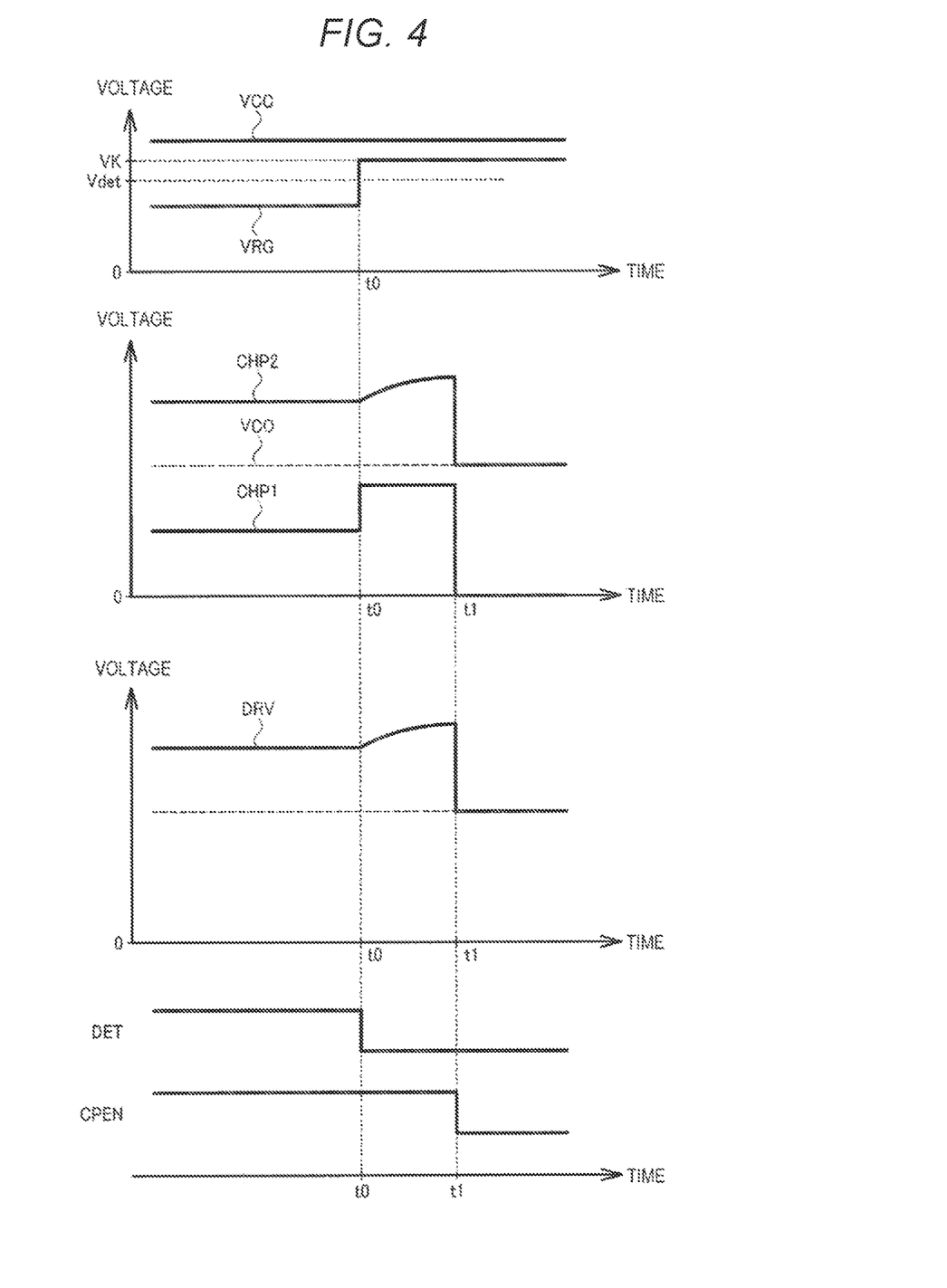
FIG. 4 is a waveform diagram showing an operation of the circuit device.

FIG. 4 is a waveform diagram showing an operation of the circuit device 100 when the first detailed configuration example is applied to FIG. 1. The drive signal CHP1 and the signal CHP2 are rectangular waves when the charge pump circuit 120 is enabled, and only a high level of the rectangular wave is shown here.

It is assumed that the regulated voltage VRG is an overvoltage of a voltage VK at a time t0. The voltage VK is a voltage higher than the detection voltage Vdet of the overvoltage detection circuit 130. The overvoltage detection circuit 130 changes the overvoltage detection signal DET from a high level to a low level at the time t0 at which the regulated voltage VRG is higher than the detection voltage Vdet. Here, the low level indicates active.

The control circuit 150 changes the enable signal CPEN from a high level to a low level at a time t1 after the overvoltage detection signal DET changes from the high level to the low level by setting a delay time t1−t0 by filtering or the like. Here, the high level indicates enable and the low level indicates disable. By setting the delay time t1−t0, a malfunction due to noise or the like can be prevented.

During a period from time t0 to t1, a high level of the drive signal CHP1 is the voltage VK. A high level of the signal CHP2 gradually rises according to a charge supplied from the drive circuit 160 via the boost capacitor 12, and gradually approaches VCO+VK. Accordingly, the gate control voltage DRV output to the gate of the N-type transistor 11 gradually rises and gradually approaches VCO+VK, and thus the gate-source voltage of the N-type transistor 11 gradually approaches VK. At this time, for example, the delay time t1−t0, at which the gate-source voltage does not exceed the maximum rating VgsMax, is set.

Figure 5:
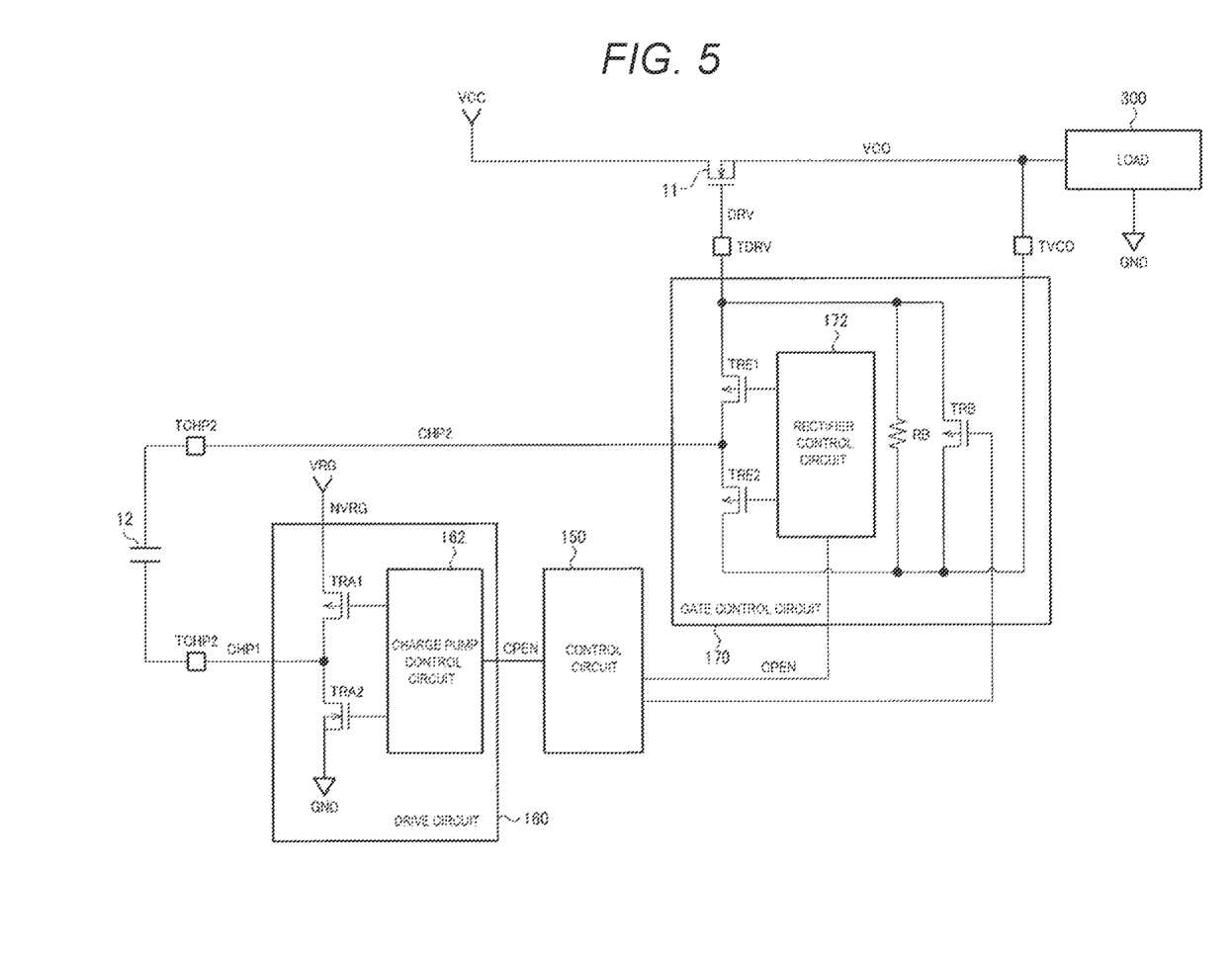
FIG. 5 is a second detailed configuration example of the drive circuit and the gate control circuit.

FIG. 5 is a second detailed configuration example of the drive circuit 160 and the gate control circuit 170. In the second detailed configuration example, the gate control circuit 170 includes transistors TRE1 and TRE2, a rectifier control circuit 172, the resistor RB, and the switch circuit TRB. The same components as those described in the first detailed configuration example are designated by the same reference numerals, and the description of the components will be omitted as appropriate.

The transistors TRE1 and TRE2 are P-type transistors. A source of the transistor TRE1 is coupled to the terminal TDRV and a drain of the transistor TRE1 is coupled to the terminal TCHP2. A source of the transistor TRE2 is coupled to the terminal TCHP2 and the drain of the transistor TRE1, and a drain of the transistor TRE2 is coupled to the source voltage input terminal TVCO.

The rectifier control circuit 172 controls rectification by the transistors TRE1 and TRE2 by switching the transistors TRE1 and TRE2 when the enable signal CPEN indicates enable. The rectifier control circuit 172 switches the transistors TRE1 and TRE2 according to switching states of the first transistor TRA1 and the second transistor TRA2 of the drive circuit 160. Specifically, the rectifier control circuit 172 turns off the transistor TRE1 and turns on the transistor TRE2 when the first transistor TRA1 is off and the second transistor TRA2 is on. The rectifier control circuit 172 turns on the transistor TRE1 and turns off the transistor TRE2 when the first transistor TRA1 is on and the second transistor TRA2 is off. Accordingly, a charge pump operation having the same signal waveform as that in FIG. 3 is implemented.

Figure 6:
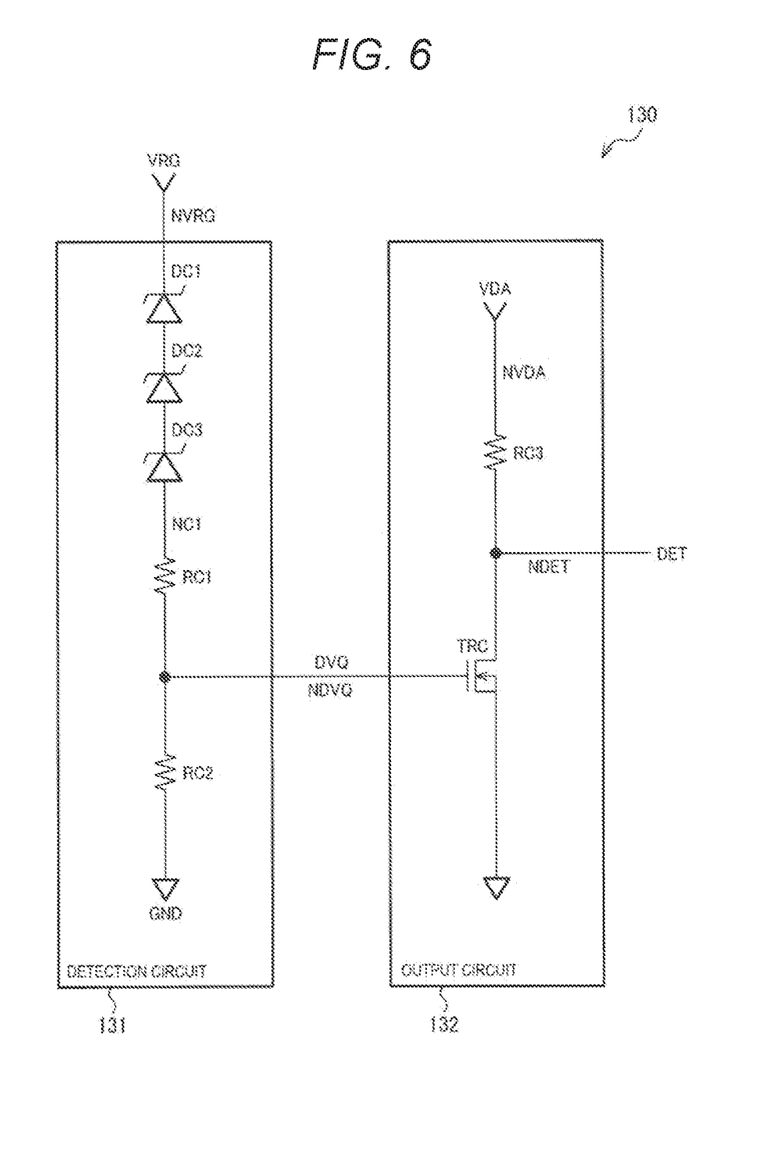
FIG. 6 is a detailed configuration example of an overvoltage detection circuit.

FIG. 6 is a detailed configuration example of the overvoltage detection circuit 130. The overvoltage detection circuit 130 includes a detection circuit 131 and an output circuit 132.

The detection circuit 131 detects whether the regulated voltage VRG exceeds the detection voltage. The detection circuit 131 includes Zener diodes DC1 to DC3, and resistors RC1 and RC2. The Zener diodes DC1 to DC3 are coupled in series between the output node NVRG of the regulator 110 and a node NC1. Forward directions of the Zener diodes DC1 to DC3 are from the node NC1 to the output node NVRG. The resistors RC1 and RC2 are coupled in series between the node NC1 and a ground node. Specifically, one end of the resistor RC1 is coupled to the node NC1 and the other end is coupled to a node NDVQ. One end of the resistor RC2 is coupled to the node NDVQ and the other end is coupled to the ground node. An output signal DVQ of the detection circuit 131 is output to the node NDVQ.

The output circuit 132 sets the output signal DVQ of the detection circuit 131 to a signal level of an internal power supply voltage VDA of the circuit device 100, and outputs the output signal DVQ as the overvoltage detection signal DET. The internal power supply voltage VDA is a power supply voltage supplied to a circuit inside the circuit device 100 such as the control circuit 150, and is a voltage lower than the regulated voltage VRG. For example, the internal power supply voltage VDA is supplied from a regulator (not shown) provided in the circuit device 100. The output circuit 132 includes a resistor RC3 and a transistor TRC. One end of the resistor RC3 is coupled to an internal power supply node NVDA and the other end of the resistor RC3 is coupled to an output node NDET of the overvoltage detection circuit 130. The transistor TRC is an N-type transistor. A drain of the transistor TRC is coupled to the output node NDET of the overvoltage detection circuit 130, a source of the transistor TRC is coupled to a ground node, and a gate of the transistor TRC is coupled to the node NDVQ.

A Zener voltage of each Zener diode is Vtz. When the regulated voltage VRG is lower than 3×Vtz, no current flows through the Zener diodes DC1 to DC3, and thus the output signal DVQ of the detection circuit 131 is the ground voltage GND. Since the transistor TRC of the output circuit 132 is off, the overvoltage detection signal DET is the internal power supply voltage VDA. When the regulated voltage VRG is higher than 3×Vtz, the Zener diodes DC1 to DC3 break down and a current flows through the Zener diodes DC1 to DC3, and a voltage of the node NC1 is VRG−3×Vtz. The resistors RC1 and RC2 divide the voltage VRG−3×Vtz, and a divided voltage is output as the output signal DVQ. The divided voltage is higher than a threshold voltage of the transistor TRC. Since the transistor TRC is on, the overvoltage detection signal DET is the ground voltage GND. In this configuration example, the detection voltage of the overvoltage is 3×Vtz.

In the above embodiment, the overvoltage detection circuit 130 includes the Zener diodes DC1 to DC3. The Zener diodes DC1 to DC3 are provided between the power supply node NVCC and the ground node, and the forward directions of the Zener diodes DC1 to DC3 are from the ground node to the power supply node NVCC. The overvoltage detection circuit 130 outputs the overvoltage detection signal DET based on a voltage on an anode side of the Zener diodes DC1 to DC3.

According to the present embodiment, by using the Zener diodes DC1 to DC3, it can be detected whether the regulated voltage VRG exceeds the Zener voltages of the Zener diodes DC1 to DC3. That is, the detection voltage of the overvoltage can be set based on the Zener voltages. Since the voltage on the anode side of the Zener diodes DC1 to DC3 changes when the regulated voltage VRG exceeds the Zener voltages of the Zener diodes DC1 to DC3, the overvoltage detection signal DET indicating whether it is an overvoltage is output by outputting the overvoltage detection signal DET based on the voltage.

Figure 7:
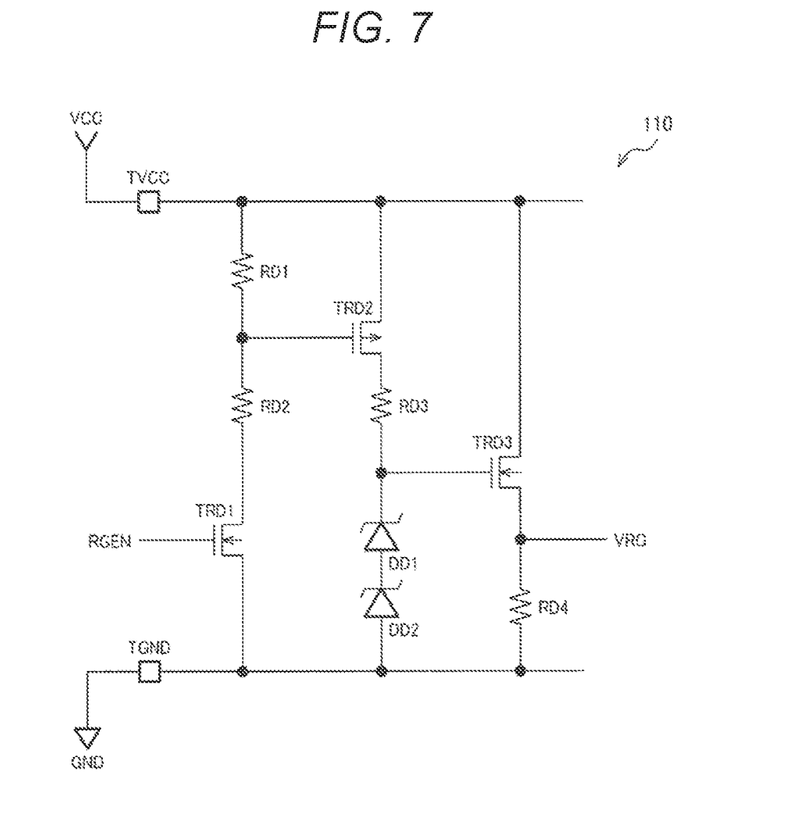
FIG. 7 is a detailed configuration example of a regulator.

FIG. 7 is a detailed configuration example of the regulator 110. The regulator 110 includes resistors RD1 to RD4, transistors TRD1 to TRD3, and Zener diodes DD1 and DD2.

One end of the resistor RD1 is coupled to the power supply node NVCC and the other end of the resistor RD1 is coupled to one end of the resistor RD2 and a gate of transistor TRD2. The other end of the resistor RD2 is coupled to a drain of the transistor TRD1. The transistor TRD1 is an N-type transistor. A source of the transistor TRD1 is coupled to a ground node, and an enable signal RGEN of the regulator 110 is input to a gate of the transistor TRD1 from the control circuit 150.

The transistor TRD2 is a P-type transistor. A source of the transistor TRD2 is coupled to the power supply node NVCC and a drain of the transistor TRD2 is coupled to one end of the resistor RD3. The other end of the resistor RD3 is coupled to a cathode of the Zener diode DD1 and a gate of the transistor TRD3. An anode of the Zener diode DD1 is coupled to a cathode of the Zener diode DD2, and an anode of the Zener diode DD2 is coupled to a ground node.

The transistor TRD3 is an N-type transistor. A drain of the transistor TRD3 is coupled to the power supply node NVCC, and a source of the transistor TRD3 is coupled to one end of the resistor RD4 and the output node NVRG of the regulator 110. The other end of the resistor RD4 is coupled to a ground node.

The regulator 110 is enabled when the enable signal RGEN is at a high level. At this time, the transistor TRD3 is on, and a divided voltage obtained by the resistors RD1 and RD2 is input to the gate of the transistor TRD2. The transistor TRD2 passes a constant current to the Zener diodes DD1 and DD2, a cathode voltage of the Zener diode DD1 is 2×Vtz, and the voltage is input to the gate of transistor TRD3. Assuming that a threshold voltage of the transistor TRD3 is Vth_trd3, a voltage 2×Vtz−Vth_trd3 is output as the regulated voltage VRG.

According to the present embodiment described above, a circuit device controls an N-type transistor provided between a power supply node and a load. The circuit device includes a regulator, a charge pump circuit, an overvoltage detection circuit, and a control circuit. The regulator regulates a power supply voltage from the power supply node to output a regulated voltage. The charge pump circuit performs a charge pump operation based on the regulated voltage to output a gate control voltage to a gate node of the N-type transistor. The overvoltage detection circuit detects an overvoltage of the regulated voltage and outputs an overvoltage detection signal that is a detection result. The control circuit performs control to stop the charge pump circuit based on the overvoltage detection signal when the overvoltage detection circuit detects the overvoltage.

Since the gate control voltage is output based on the regulated voltage, an overvoltage may be applied to the gate node of the N-type transistor when the regulated voltage is an overvoltage. According to the present embodiment, the control circuit stops the charge pump circuit when the overvoltage detection circuit detects the overvoltage of the regulated voltage, and thus the N-type transistor can be protected from the overvoltage.

Further, in the present embodiment, the charge pump circuit may perform boosting based on the regulated voltage with reference to the source voltage of the N-type transistor to output the gate control voltage.

A boosted voltage based on the regulated voltage is a gate-source voltage of the N-type transistor, and thus an overvoltage may be applied between the gate and source of the N-type transistor when the regulated voltage is an overvoltage. According to the present embodiment, the control circuit stops the charge pump circuit when the overvoltage detection circuit detects the overvoltage of the regulated voltage, and thus the N-type transistor can be protected from the overvoltage.

Further, in the present embodiment, the circuit device may include a source voltage input terminal to which the source voltage is input. The charge pump circuit may perform the boosting with reference to the source voltage input to the source voltage input terminal.

According to the present embodiment, the source voltage of the N-type transistor can be input to the charge pump circuit via the source voltage input terminal. The charge pump circuit can perform the boosting based on the regulated voltage with reference to the source voltage.

Further, in the present embodiment, the gate control voltage may be DRV=VCO+VRG, where the source voltage of the N-type transistor is VCO, the regulated voltage is VRG, a maximum rating of the gate-source voltage of the N-type transistor is VgsMax, and a detection voltage of the overvoltage is Vdet. The overvoltage detection circuit may detect the overvoltage by comparing the detection voltage Vdet, the detection voltage Vdet satisfying VRG<Vdet<VgsMax, with the regulated voltage VRG.

Since DRV−VCO=VRG is applied between the gate and source of the N-type transistor, a comparison between the regulated voltage and the detection voltage corresponds to a comparison between the gate-source voltage and the detection voltage. According to the present embodiment, VRG<Vdet<VgsMax, so that the overvoltage of the gate-source voltage can be detected by the detection voltage Vdet that does not exceed the maximum rating VgsMax of the gate-source voltage.

Further, in the present embodiment, the detection voltage Vdet may satisfy VRG<Vdet<VgsMax<VCC, where VCC is the power supply voltage.

Since the regulated voltage VRG is lower than the power supply voltage VCC, an output node of the regulator may output the same voltage as the power supply voltage VCC to the maximum. Since the regulated voltage VRG is the gate-source voltage of the N-type transistor, the maximum power supply voltage VCC may be applied between the gate and the source, and the N-type transistor may fail since VgsMax<VCC. According to the present embodiment, since the overvoltage of the gate-source voltage is detected by the detection voltage Vdet that does not exceed the maximum rating VgsMax of the gate-source voltage, the N-type transistor can be protected from the overvoltage.

Further, in the present embodiment, the overvoltage detection circuit includes a Zener diode. The Zener diode may be provided between the power supply node and a ground node. A forward direction of the Zener diode may be from the ground node to the power supply node. The overvoltage detection circuit may output the overvoltage detection signal based on a voltage on an anode side of the Zener diode.

According to the present embodiment, by using the Zener diode, it can be detected whether the regulated voltage exceeds a Zener voltage of the Zener diode. That is, the detection voltage of the overvoltage can be set based on the Zener voltage. The voltage on the anode side of the Zener diode changes when the regulated voltage exceeds the Zener voltage of the Zener diode, and thus the overvoltage detection signal indicating whether it is an overvoltage is output by outputting the overvoltage detection signal based on the voltage.

Further, in the present embodiment, the charge pump circuit may include a drive circuit and a gate control circuit. The drive circuit may output a drive signal to one end of a boost capacitor based on the regulated voltage when the charge pump circuit receives an enable signal from the control circuit and the enable signal indicates enable. The gate control circuit may output the gate control voltage based on a signal received from the other end of the boost capacitor and the source voltage of the N-type transistor. The control circuit may stop the drive circuit by outputting the enable signal indicating disable when the overvoltage detection circuit detects the overvoltage.

According to the present embodiment, when the enable signal indicates enable, the drive circuit outputs the drive signal and the gate control circuit outputs the gate control voltage. Then, when the enable signal indicates disable, an output of the drive signal is stopped, so that an output of the gate control voltage is stopped. Accordingly, the control circuit can stop the charge pump circuit by outputting the enable signal indicating disable when the overvoltage is detected.

Further, in the present embodiment, the drive circuit may include a first transistor provided between an output node of the regulator and one end of the boost capacitor, and a second transistor provided between the one end of the boost capacitor and a ground node. The gate control circuit may include a first diode provided between the other end of the boost capacitor and the gate node of the N-type transistor, and a second diode provided between a source node of the N-type transistor and the other end of the boost capacitor. A forward direction of the first diode may be from the other end of the boost capacitor to the gate node. A forward direction of the second diode may be from the source node of the N-type transistor to the other end of the boost capacitor.

According to the present embodiment, when the first transistor is off and the second diode is on, an anode voltage of the first diode is the source voltage of the N-type transistor, and when the first transistor is on and the second diode is off, the anode voltage of the first diode is a voltage obtained by adding the regulated voltage to the source voltage of the N-type transistor. This voltage is output to the gate node of the N-type transistor via the first diode. Accordingly, the same voltage as the regulated voltage is applied between the gate and the source of the N-type transistor. In the present embodiment, when the regulated voltage is an overvoltage, the charge pump circuit is stopped, so that the gate and the source of the N-type transistor are protected from the overvoltage.

Further, in the present embodiment, the gate control circuit may include a resistor provided between the gate node and the source node of the N-type transistor.

According to the present embodiment, after the charge pump circuit is stopped, the gate node and the source node of the N-type transistor have the same potential via the resistor, so that the N-type transistor is off.

Further, in the present embodiment, the gate control circuit may include a switch circuit. The switch circuit is provided between the gate node and the source node of the N-type transistor and is on when the N-type transistor is off.

According to the present embodiment, the N-type transistor can be fixed off by turning on the switch circuit. For example, when the circuit device is shut down, the switch circuit TRB is on, so that the power supply to the load can be reliably cut off.

Although the present embodiment has been described in detail as described above, it will be readily apparent to those skilled in the art that many modifications may be made without departing substantially from novel matters and effects of the present disclosure. Therefore, all such modifications are intended to be included in the scope of the present disclosure. For example, in the specification or the drawings, a term that is described at least once together with a different term having a broader meaning or the same meaning can be replaced with the different term in any parts of the specification or the drawings. All combinations of the present embodiment and the modifications are also included in the scope of the present disclosure. Further, configurations and operations of the regulator, the overvoltage detection circuit, the charge pump circuit, the control circuit, the load, the circuit device, and the electronic machine are not limited to those described in the present embodiment, and various modifications may be made.

What is claimed is:

1. A circuit device that controls an N-type transistor provided between a power supply node and a load, the circuit device comprising:
    a regulator configured to regulate a power supply voltage from the power supply node to output a regulated voltage;
    a charge pump circuit configured to perform a charge pump operation based on the regulated voltage to output a gate control voltage to a gate node of the N-type transistor;
    an overvoltage detection circuit configured to detect an overvoltage of the regulated voltage and output an overvoltage detection signal that is a detection result; and
    a control circuit configured to perform control to stop the charge pump circuit based on the overvoltage detection signal when the overvoltage detection circuit detects the overvoltage.

2. The circuit device according to claim 1, wherein
the charge pump circuit performs boosting based on the regulated voltage with reference to a source voltage of the N-type transistor to output the gate control voltage.

3. The circuit device according to claim 2, further comprising:
    a source voltage input terminal to which the source voltage is input, wherein
    the charge pump circuit performs the boosting with reference to the source voltage input to the source voltage input terminal.

4. The circuit device according to claim 2, wherein
the gate control voltage is DRV=VCO+VRG, where the source voltage of the N-type transistor is VCO, the regulated voltage is VRG, a maximum rating of a gate-source voltage of the N-type transistor is VgsMax, and a detection voltage of the overvoltage is Vdet, and
the overvoltage detection circuit detects the overvoltage by comparing the detection voltage Vdet, the detection voltage Vdet satisfying VRG<Vdet<VgsMax, with the regulated voltage VRG.

5. The circuit device according to claim 4, wherein
the detection voltage Vdet satisfies VRG<Vdet<VgsMax<VCC, where VCC is the power supply voltage.

6. The circuit device according to claim 4, wherein
the overvoltage detection circuit includes a Zener diode provided between the power supply node and a ground node and having a forward direction from the ground node to the power supply node, and outputs the overvoltage detection signal based on a voltage on an anode side of the Zener diode.

7. The circuit device according to claim 2, wherein
the charge pump circuit includes:
    a drive circuit configured to output a drive signal to one end of a boost capacitor based on the regulated voltage when the charge pump circuit receives an enable signal from the control circuit and the enable signal indicates enable; and
    a gate control circuit configured to output the gate control voltage based on a signal received from other end of the boost capacitor and the source voltage of the N-type transistor, and
the control circuit stops the drive circuit by outputting the enable signal indicating disable when the overvoltage detection circuit detects the overvoltage.

8. The circuit device according to claim 7, wherein
the drive circuit includes:
    a first transistor provided between an output node of the regulator and the one end of the boost capacitor; and
    a second transistor provided between the one end of the boost capacitor and a ground node, and
the gate voltage control circuit includes:
    a first diode provided between the other end of the boost capacitor and the gate node of the N-type transistor and having a forward direction from the other end of the boost capacitor to the gate node; and
    a second diode provided between a source node of the N-type transistor and the other end of the boost capacitor and having a forward direction from the source node of the N-type transistor to the other end of the boost capacitor.

9. The circuit device according to claim 8, wherein
the gate control circuit further includes a resistor provided between the gate node and the source node of the N-type transistor.

10. The circuit device according to claim 8, wherein
the gate control circuit further includes a switch circuit provided between the gate node and the source node of the N-type transistor and being on when the N-type transistor is off.

* * * * *